(12) United States Patent
Wu et al.

(10) Patent No.: US 9,806,101 B2
(45) Date of Patent: Oct. 31, 2017

(54) PIXEL ARRAY HAVING STRIP-SHAPED ELECTRODES, DISPLAY PANEL, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaojuan Wu, Beijing (CN); Li Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/081,346

(22) Filed: Mar. 25, 2016

(65) Prior Publication Data
US 2017/0077142 A1 Mar. 16, 2017

(30) Foreign Application Priority Data
Sep. 15, 2015 (CN) .......................... 2015 1 0587540

(51) Int. Cl.
*H01L 27/12* (2006.01)
*G02F 1/1362* (2006.01)
*G02F 1/1368* (2006.01)
*G02F 1/1343* (2006.01)

(52) U.S. Cl.
CPC .......... *H01L 27/124* (2013.01); *G02F 1/1368* (2013.01); *G02F 1/13439* (2013.01); *G02F 1/134309* (2013.01); *G02F 1/136209* (2013.01); *G02F 1/136286* (2013.01)

(58) Field of Classification Search
CPC ............... H01L 27/1214; H01L 27/156; H01L 27/14607; H01L 27/14643; H01L 27/14645; H01L 33/06; H01L 33/30; H01L 33/08; H01L 33/20; H01L 51/56; H01L 51/5612; H01L 27/124
See application file for complete search history.

(56) References Cited

U.S. PATENT DOCUMENTS

| 7,453,539 | B2 * | 11/2008 | Matsuoka | ......... G02F 1/134363 349/139 |
| 2013/0120680 | A1 * | 5/2013 | Sun | ....................... G02F 1/1368 349/43 |

* cited by examiner

*Primary Examiner* — Benjamin Sandvik
*Assistant Examiner* — Damon Hillman
(74) *Attorney, Agent, or Firm* — Nath, Goldberg & Meyer; Joshua B. Goldberg; Annie J. Kock

(57) ABSTRACT

The present invention provides a pixel array, a display panel and a display device, and the pixel array includes a plurality of gate lines and a plurality of data lines intersecting and insulated from each other, and a plurality of pixel units defined by the plurality of gate lines and the plurality of data lines intersecting each other. Each of the plurality of pixel units includes a thin-film transistor and a strip-shaped electrode, the strip-shaped electrodes of two adjacent pixel units in a same column have different inclination directions, the thin-film transistors of the two adjacent pixel units are in inclination angle regions of the two adjacent pixel units, respectively, and the inclination angle region is a region corresponding to a position at which extending directions of the strip-shaped electrode and the gate line intersect to form an acute angle in a pixel unit.

10 Claims, 2 Drawing Sheets

PIXEL ARRAY HAVING STRIP-SHAPED ELECTRODES, DISPLAY PANEL, AND DISPLAY DEVICE

FIELD OF THE INVENTION

The present invention belongs to the field of display technology, and specifically relates to a pixel array, a display panel and a display device.

BACKGROUND OF THE INVENTION

With the development of science and technology, conventional single-domain liquid crystal displays cannot meet people's needs due to their shortcomings of low contrast ratio, asymmetrical viewing angle and occurrence of color shift when viewing a display image at different angles. A compensated full-view polarizer can be employed to reduce color shift in liquid crystal displays.

In the existing technology, 2P2D pixel structure is used in liquid crystal displays (that is, dual-domain liquid crystal display), which can reduce color shift. However, in a conventional 2P2D pixel structure, defects such as horizontal stripes and the like will occur since the luminous efficiencies of two adjacent pixel units (hereinafter referred to as upper pixel unit and lower pixel unit) in a same column are different. Specifically, FIGS. 1 and 2 are schematic structure diagrams of an upper pixel unit and a lower pixel unit in a conventional 2P2D pixel array, respectively, where reference numeral "1" denotes a data line of the upper pixel unit, reference numeral "2" denotes a gate line of the upper pixel unit, reference numeral "3" denotes a drain of the upper pixel unit, reference numeral "4" denotes a source of the upper pixel unit, reference numeral "5" denotes a gate of the upper pixel unit, reference numeral "6" denotes a plate-shaped electrode of the upper pixel unit, reference numeral "7" denotes strip-shaped electrodes of the upper pixel unit, reference numeral "8" denotes a black matrix of the upper pixel unit, reference numeral "9" denotes a data line of the lower pixel unit, reference numeral "10" denotes a gate line of the lower pixel unit, reference numeral "11" denotes a drain of the lower pixel unit, reference numeral "12" denotes a source of the lower pixel unit, reference numeral "13" denotes a gate of the lower pixel unit, reference numeral "14" denotes a plate-shaped electrode of the lower pixel unit, reference numeral "15" denotes strip-shaped electrodes of the lower pixel unit, and reference numeral "16" denotes a black matrix of the lower pixel unit. The drain 3, the source 4 and the gate 5 of the upper pixel unit constitute a thin-film transistor of the upper pixel unit, and the drain 11, the source 12 and the gate 13 of the lower pixel unit constitute a thin-film transistor of the lower pixel unit. In a conventional 2P2D pixel array, the upper pixel unit and the lower pixel unit have the same aperture ratio, and the thin-film transistors thereof are located at the same position in respective pixel units, whereas the strip-shaped electrodes have different inclination directions between the upper pixel unit and the lower pixel unit. In this way, such arrangement plays a role of compensation, and color shift at side viewing angles can be alleviated. Specifically, as illustrated in FIGS. 1 and 2, the thin-film transistor of the upper pixel unit in FIG. 1 is located in a region (hereinafter referred to as "inclination angle region") corresponding to a position at which extending directions of the strip-shaped electrode 7 and the gate line 2 intersect to form an acute angle, and the thin-film transistor of the lower pixel unit in FIG. 2 is located in a region (hereinafter referred to as "supplementary inclination angle region") corresponding to a position at which extending directions of the strip-shaped electrode 15 and the gate line 10 intersect to form an obtuse angle. When the thin-film transistor is in the inclination angle region of the pixel unit (for example, in the case of the upper pixel unit of FIG. 1), the strip-shaped electrode 7 can easily extend into a region corresponding to the black matrix 8, so the luminous efficiency at an edge end of the strip-shaped electrode 7 is large and dark area is small. When the thin-film transistor is in the supplementary inclination angle region of the pixel unit (for example, in the case of the lower pixel unit of FIG. 2), the strip-shaped electrode 15 can hardly extend into a region corresponding to the black matrix 16, so the luminous efficiency at an edge end of the strip-shaped electrode 15 is small and dark area is large. Since the upper pixel unit and the lower pixel unit have the same aperture ratio but different luminous efficiencies, the overall luminous efficiency of the upper pixel unit is different from that of the lower pixel unit, which is very likely to result in defects such as horizontal stripes and the like.

SUMMARY OF THE INVENTION

In order to solve the above problems in the existing pixel array, the present invention provides a pixel array, a display panel and a display device with excellent display effect.

The technical solution used for solving the technical problems in the present invention is a pixel array, which includes a plurality of gate lines and a plurality of data lines intersecting and insulated from each other, and a plurality of pixel units defined by the plurality of gate lines and the plurality of data lines intersecting each other. Each of the plurality of pixel units includes a thin-film transistor and a strip-shaped electrode, the strip-shaped electrodes of two adjacent pixel units in a same column have different inclination directions, the thin-film transistors of the two adjacent pixel units are in inclination angle regions of the two adjacent pixel units, respectively, and the inclination angle region is a region corresponding to a position at which extending directions of the strip-shaped electrode and the gate line intersect to form an acute angle in a pixel unit.

Preferably, one end of each strip-shaped electrode, which is close to the thin-film transistor in the same pixel unit, has a first corner part extending towards a side of the strip-shaped electrode away from the thin-film transistor, and the other end of the strip-shaped electrode has a second corner part extending towards a side of the strip-shaped electrode at which the thin-film transistor is located.

Preferably, the inclination directions of the strip-shaped electrodes of the two adjacent pixel units in the same column, among the plurality of pixel units, are substantially symmetric with respect to the gate line.

Preferably, sources of the thin-film transistors of the two adjacent pixel units in the same column, among the plurality of pixel units, are connected to different data lines, respectively.

Preferably, the strip-shaped electrodes of the pixel units in a same row, among the plurality of pixel units, have the same inclination direction.

Preferably, each of the plurality of pixel units further includes a plate-shaped electrode located under a layer of the strip-shaped electrodes.

Further preferably, one of the strip-shaped electrode and the plate-shaped electrode is pixel electrode and the other is common electrode.

Preferably, each of the plurality of pixel units is further provided with a black matrix above a layer of the gate lines, a layer of the data lines and a layer of the thin-film transistors.

Preferably, in each pixel unit, the first and second corner parts of the strip-shaped electrode extend into a region corresponding to the black matrix, respectively.

The technical solution used for solving the technical problems in the present invention is a display panel including the above-mentioned pixel array.

The technical solution used for solving the technical problems in the present invention is a display device including the above-mentioned display panel.

The beneficial effect of the present invention is as follows:

Since the thin-film transistors of two adjacent pixel units in the same column of the pixel array according to the present invention are all located in the inclination angle regions (that is, a region corresponding to a position at which extending directions of the strip-shaped electrode and the gate line intersect to form an acute angle in a pixel unit) of respective pixel units, both ends of the strip-shaped electrode can easily extend into the region corresponding to the black matrix, and the two adjacent pixel units have the same aperture ratio, so the luminous efficiencies of the two pixel units are substantially the same, thereby avoiding the occurrence of defects such as horizontal stripes and the like.

DETAILED DESCRIPTION OF THE EMBODIMENTS

To make those skilled in the art better understand the technical solutions of the present invention, the present invention will be further described in detail below in conjunction with the accompanying drawings and specific implementations.

[First Embodiment]

This embodiment provides a pixel array, which includes a plurality of gate lines and a plurality of data lines intersecting and insulated from each other, and a plurality of pixel units defined by the plurality of gate lines and the plurality of data lines intersecting each other. Each of the plurality of pixel units includes a thin-film transistor and strip-shaped electrodes. The strip-shaped electrodes in two adjacent pixel units in a same column have different inclination directions, and the thin-film transistors of the two adjacent pixel units are in inclination angle regions of the respective pixel units, respectively, and the inclination angle region is a region corresponding to a position at which extending directions of the strip-shaped electrodes and the gate lines intersect to form an acute angle in a pixel unit.

It is known to those skilled in the art that the thin-film transistor of each pixel unit is disposed in a region adjacent to the intersection point of the gate line and the data line of the pixel unit. Taking the pixel unit in a shape of parallelogram as an example, the thin-film transistor is in a region of one vertex angle of the pixel unit in a shape of parallelogram, the gate of the thin-film transistor is connected to the gate line, the source of the thin-film transistor is connected to the data line, and the drain of the thin-film transistor is connected to the plate-shaped electrode. In this embodiment, the thin-film transistor of each pixel unit is in the inclination angle region of the pixel unit, and the inclination angle region refers to a region corresponding to a position at Which extending directions of the strip-shaped electrode and the gate line intersect to form an acute angle and adjacent to one vertex angle of the pixel unit in a shape of parallelogram. There are two such regions in each pixel unit, which are adjacent to a pair of opposite angles of the parallelogram, respectively. The thin-film transistor may be disposed in either of the two regions.

Figure 1:
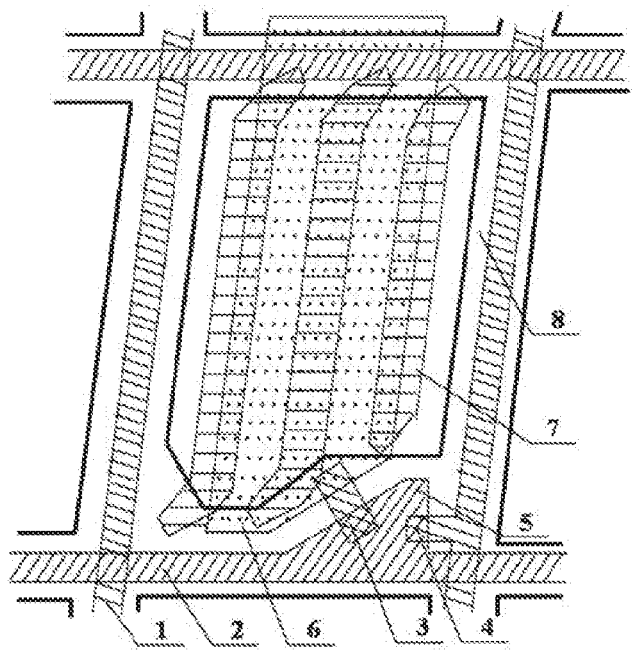
FIG. 1 is a schematic diagram of an upper pixel unit in an existing pixel array.
Figure 2:
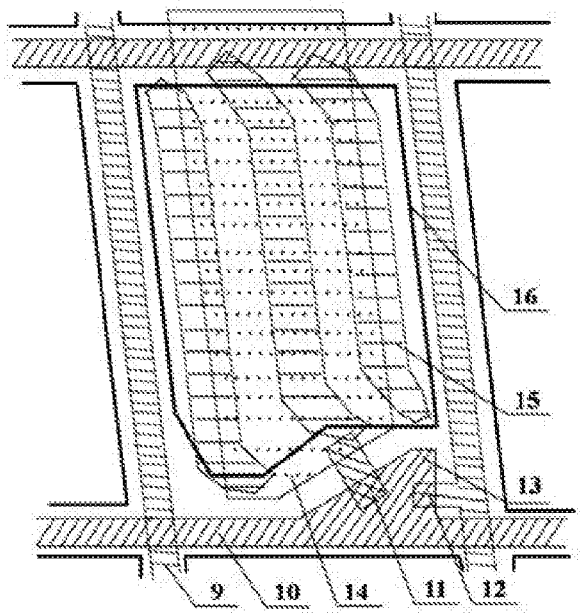
FIG. 2 is a schematic diagram of a lower pixel unit in an existing pixel array.
Figure 3:
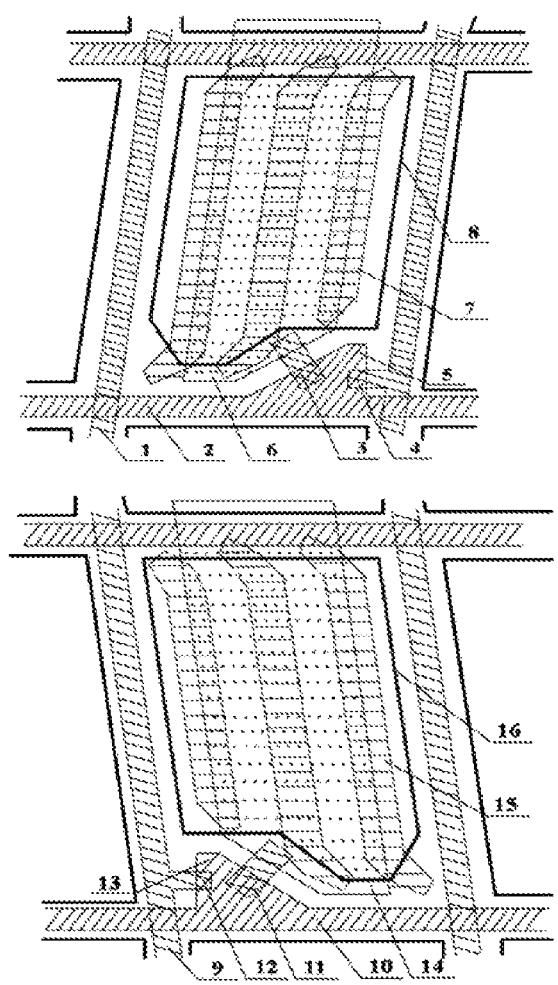
FIG. 3 is a schematic diagram of two adjacent pixel units, in a same column, of the pixel array according to a first embodiment of the present invention.

Specifically, as illustrated in FIG. 3, in two adjacent pixel units in the same column (hereinafter referred to as "upper pixel unit" and "lower pixel unit"), the inclination direction of the strip-shaped electrode 7 of the upper pixel unit is configured such that the strip-shaped electrode 7 inclines from the upper right to the lower left of the upper pixel unit. In this case, the thin-film transistor (where the source 4 thereof is connected to the data line 1, the drain 3 thereof is connected to the plate-shaped electrode 6, and the gate 5 thereof is connected to the gate line 2) in the upper pixel unit is located at the lower right corner (or the upper left corner) of the upper pixel unit. The inclination direction of the strip-shaped electrode 15 of the lower pixel unit is configured such that the strip-shaped electrode 15 inclines from the upper left to the lower right of the lower pixel unit. In this case, the thin-film transistor (where the source 12 thereof is connected to the data line 9, the drain 11 thereof is connected to the plate-shaped electrode 14, and the gate 13 thereof is connected to the gate line 10) in the lower pixel unit is located at the lower left corner (or the upper right corner) of the lower pixel unit. It can be understood by those skilled in the art that the black matrixes 8 and 16 are structures which are located above the gate lines, the data lines, the thin-film transistors and the like, and used for blocking light. In the two pixel units as illustrated in FIG. 3, both ends of each strip-shaped electrode extend into the region corresponding to the black matrix, i.e., both ends of the strip-shaped electrode 7 extend into the region corresponding to the black matrix 8 and both ends of the strip-shaped electrode 15 extend into the region corresponding to the black matrix 16; in the meantime, the two adjacent pixel units have the same aperture ratio, so that the luminous efficiencies of the two pixel units are substantially the same, thereby avoiding the occurrence of defects such as horizontal stripes and the like.

Preferably, one end of each strip-shaped electrode, which is close to the thin-film transistor in the same pixel unit, has a first corner part towards a side of the strip-shaped electrode away from the thin-film transistor, and the other end of the strip-shaped electrode has a second corner part extending towards a side of the strip-shaped electrode at which the thin-film transistor is located. Specifically, taking the strip-shaped electrode 7 of the upper pixel unit in FIG. 3 as an example, one end of the strip-shaped electrode 7, which is away from the thin-film transistor, has the second corner part bending towards the upper right corner of the pixel unit, and the other end of the strip-shaped electrode 7, which is close to the thin-film transistor, has the first corner part bending towards the lower left corner of the pixel unit. Such arrangement takes full advantage of the area in the pixel unit to minimize the aperture ratio.

Preferably, in this embodiment, the inclination directions of the strip-shaped electrode 7 and the strip-shaped electrode 15 of two adjacent pixel units in the same column are symmetric with respect to the extending direction of the gate lines 2 and 10, thereby facilitating obtaining optimum display effect. In practice, the inclination directions of the two strip-shaped electrodes only need to be different and does not have to be strictly symmetric.

It needs to be set forth herein that the inclination direction of the strip-shaped electrode 7 in this embodiment means the inclination direction of the main body part, other than the corner parts, of the strip-shaped electrode 7.

Preferably, in this embodiment, the sources of the thin-film transistors in two adjacent pixel units in the same column are connected to different data lines, respectively. As illustrated in FIG. 3, the source 4 of the thin-film transistor in the upper pixel unit is connected to the data line 1 at the right side of the thin-film transistor, whereas the source 12 of the thin-film transistor of the lower pixel unit is connected to the data line 9 at the left side of the thin-film transistor. By means of such arrangement, the thin-film transistors may be disposed in the pixel array uniformly, and thus the display effect can be more uniform.

Preferably, in this embodiment, the strip-shaped electrodes of the pixel units in a same row have substantially the same inclination direction. Specifically, the strip-shaped electrodes 7 of the upper pixel units in the same row have substantially the same inclination direction, and the strip-shaped electrodes 15 in the lower pixel units in the same row have substantially the same inclination direction. Such arrangement facilitates the manufacture of the pixel array, but it should be understood that it is necessary that the inclination directions of the strip-shaped electrodes of two adjacent pixel units in the same column are different.

In this embodiment, each pixel unit further includes the plate-shaped electrode under the strip-shaped electrodes, and an insulating layer provided therebetween. One of the strip-shaped electrode and the plate-shaped electrode is pixel electrode and the other is common electrode, In the figure of this embodiment, the plate-shaped electrode is pixel electrode and the strip-shaped electrodes are common electrode.

[Second Embodiment]

This embodiment provides a display panel and a display device, and the display panel includes the pixel array in the first embodiment.

Since the display panel in this embodiment includes the above-mentioned pixel array, the display effect thereof is excellent.

The display device of this embodiment may be any product or component with the function of display, such as a mobile phone, a tablet computer, a television, a display, a notebook computer, a digital photo frame, a navigator or the like.

Apparently, the display device of this embodiment may further include other common structures such as a backlight source, a power supply unit, a display driving unit and the like.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A pixel array, comprising a plurality of gate lines and a plurality of data lines intersecting and insulated from each other, and a plurality of pixel units defined by the plurality of gate lines and the plurality of data lines intersecting each other, wherein, each of the plurality of pixel units includes a thin-film transistor and a strip-shaped electrode, the strip-shaped electrodes of two adjacent pixel units in a same column have different inclination directions, and the thin-film transistors of the two adjacent pixel units are in inclination angle regions of the two adjacent pixel units, respectively, where the inclination angle region is a region corresponding to a position at which extending directions of the strip-shaped electrode and the gate line intersect to form an acute angle in a pixel unit, wherein in a case where each of the plurality of pixel units includes a plurality of strip-shaped electrodes, all of the strip-shaped electrodes in each of the plurality of pixel units are inclined along a same direction, and wherein one end of each strip-shaped electrode, which is close to the thin-film transistor in the same pixel unit, has a first corner part extending towards a side of the strip-shaped electrode away from the thin-film transistor, and the other end of the strip-shaped electrode has a second corner part extending towards a side of the strip-shaped electrode at which the thin-film transistor is located.

2. The pixel array according to claim 1, wherein the inclination directions of the strip-shaped electrodes of the two adjacent pixel units in the same column are substantially symmetric with respect to the gate line.

3. The pixel array according to claim 1, wherein sources of the thin-film transistors of the two adjacent pixel units in the same column are connected to different data lines, respectively.

4. The pixel array according to claim 1, wherein the strip-shaped electrodes of the pixel units in a same row among the plurality of pixel units have substantially the same inclination direction.

5. The pixel array according to claim 1, wherein each of the plurality of pixel units further includes a plate-shaped electrode located under a layer of the strip-shaped electrodes.

6. The pixel array according to claim 5, wherein one of the strip-shaped electrode and the plate-shaped electrode is pixel electrode and the other is common electrode.

7. The pixel array according to claim 1, wherein each of the plurality of pixel units is further provided with a black matrix above a layer of the gate lines, a layer of the data lines and a layer of the thin-film transistors.

8. The pixel array according to claim 1, wherein each of the plurality of pixel units is further provided with a black matrix above a layer of the gate lines, a layer of the data lines and a layer of the thin-film transistors, and the first and second corner parts of the strip-shaped electrode extend into a region corresponding to the black matrix, respectively.

9. A display panel, comprising the pixel array according to claim 1.

10. A display device, comprising the display panel according to claim 9.

* * * * *